United States Patent
Oh

(10) Patent No.: US 8,450,815 B2
(45) Date of Patent: May 28, 2013

(54) HIGH VOLTAGE DEVICE

(75) Inventor: Bo-Seok Oh, Chungcheongbuk-do (KR)

(73) Assignee: Magnachip Semiconductor Ltd., Cheongju-si (KR)

( * ) Notice: Subject to any disclaimer, the term of this patent is extended or adjusted under 35 U.S.C. 154(b) by 151 days.

(21) Appl. No.: 12/216,870

(22) Filed: Jul. 11, 2008

(65) Prior Publication Data

US 2009/0014815 A1    Jan. 15, 2009

(30) Foreign Application Priority Data

Jul. 13, 2007  (KR) .................. 10-2007-0070666

(51) Int. Cl.
*H01L 21/336* (2006.01)

(52) U.S. Cl.
USPC ................................ 257/409; 257/E29.256

(58) Field of Classification Search
USPC ................... 257/213–413, E29.256
See application file for complete search history.

(56) References Cited

U.S. PATENT DOCUMENTS

| | | | | |
|---|---|---|---|---|
| 6,404,011 | B2 * | 6/2002 | Kim et al. | 257/341 |
| 6,531,732 | B2 * | 3/2003 | Sugita et al. | 257/315 |
| 2003/0127697 | A1 * | 7/2003 | Ohta et al. | 257/390 |
| 2005/0167778 | A1 * | 8/2005 | Kim et al. | 257/510 |
| 2005/0184335 | A1 * | 8/2005 | Gi Lee | 257/327 |
| 2007/0096225 | A1 * | 5/2007 | Khemka et al. | 257/409 |
| 2007/0200184 | A1 * | 8/2007 | Zhu et al. | 257/409 |
| 2008/0237706 | A1 * | 10/2008 | Williams et al. | 257/343 |

FOREIGN PATENT DOCUMENTS

| | | | |
|---|---|---|---|
| KR | 1020050063315 A | | 6/2005 |
| KR | 10-2006-0006595 | * | 1/2006 |

OTHER PUBLICATIONS

Machine translation of KR10-2006-0006595.*

* cited by examiner

*Primary Examiner* — Tucker Wright
(74) *Attorney, Agent, or Firm* — NSIP Law

(57) ABSTRACT

A high voltage device includes drift regions formed in a substrate, an isolation layer formed in the substrate to isolate neighboring drift regions, wherein the isolation layer has a depth greater than that of the drift region, a gate electrode formed over the substrate, and source and drain regions formed in the drift regions on both sides of the gate electrode.

24 Claims, 8 Drawing Sheets

HIGH VOLTAGE DEVICE

CROSS-REFERENCE TO RELATED APPLICATIONS

This application claims the benefit under 35 U.S.C. §119 (a) of Korean Patent Application No. 10-2007-0070666 filed on Jul. 13, 2007, the entire disclosure of which is incorporated herein by reference for all purposes.

BACKGROUND OF THE INVENTION

The following description relates to a method for fabricating a semiconductor device, and to a high voltage device and a method for fabricating the same.

When a semiconductor integrated circuit (IC) directly controls external systems using a high voltage, a high voltage device is required in the IC, wherein the high voltage provided from the external is directly applied to the high voltage device.

FIG. 1 illustrates a cross-sectional view of a high voltage transistor among typical high voltage devices.

Referring to FIG. 1, the typical high voltage transistor includes a drift region 103 formed in a well for high voltage 101 to obtain a high breakdown voltage. Furthermore, the typical high voltage transistor includes a field stop area (FSA) formed under a field oxide layer 102 which is formed between neighboring drift regions to separate the neighboring drift regions.

In the meantime, reference numerals 100, 104, 105, 106, 107, 108 and 109 represent a substrate, a gate insulation layer, a gate electrode, a gate pattern, a spacer, a source/drain region and a pick-up region, respectively.

As described above, the high voltage transistor includes the FSA formed between neighboring drift regions to isolate the neighboring drift regions. Thus, it is hard to accomplish high integration since an area where the FSA is formed is required under the field oxide layer 102 between the neighboring drift regions 103 is required.

SUMMARY OF THE INVENTION

General aspects relate to a high voltage device and a method for fabricating the same to accomplish high integration of a semiconductor device.

In one general aspect, there is provided a high voltage device. The high voltage device includes drift regions formed in a substrate, an isolation layer formed in the substrate to isolate neighboring drift regions, wherein the isolation layer has a depth greater than that of the drift region, a gate electrode formed over the substrate, and source and drain regions formed in the drift regions on both sides of the gate electrode.

In another aspect, there is provided a method for fabricating a high voltage device. The method includes forming an isolation layer in a substrate to define an active region, forming drift regions with a depth less than that of the isolation layer in a portion of the active region, forming a gate electrode over the active region, and forming source and drain regions in the drift regions on both sides of the gate electrode.

DETAILED DESCRIPTION

Hereinafter, general aspects of a high voltage device and a method for fabricating the same will be described in detail with reference to the accompanying drawings.

It will be understood that when an element such as a layer, a film, a pattern and a region is referred to as being 'on/under' another element herein, it may be directly on/under the other element, or one or more intervening elements may also be present.

Figure 1:
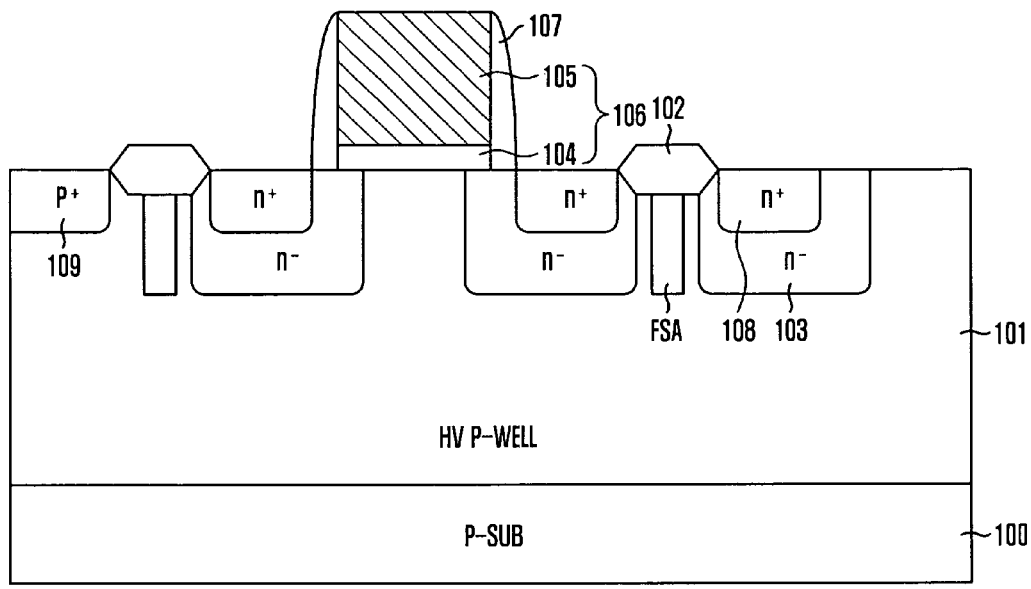
FIG. 1 illustrates a cross-sectional view of a typical high voltage device.
Figure 2:
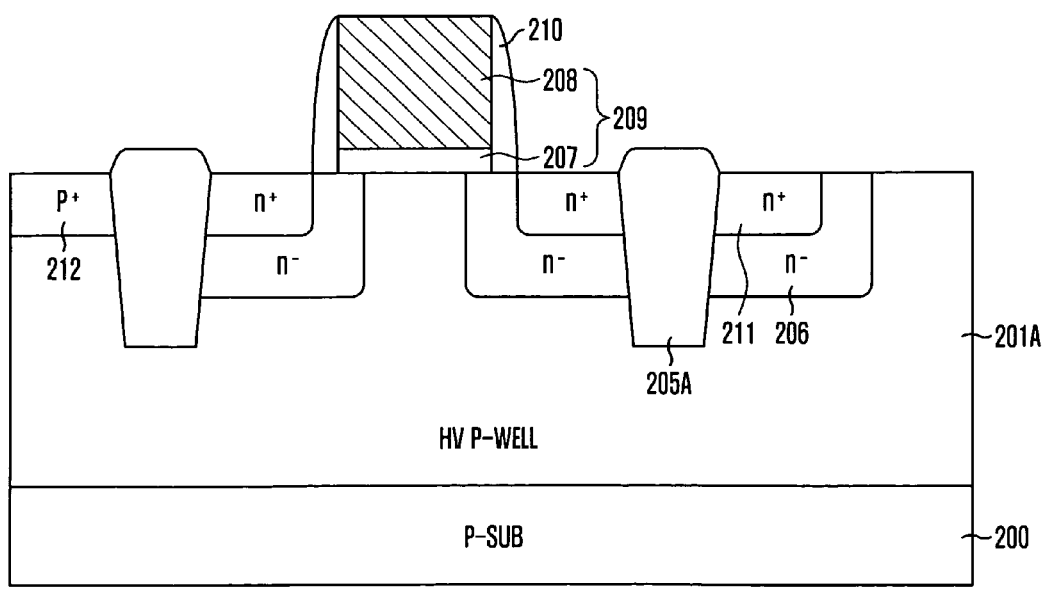
FIG. 2 is a cross-sectional view illustrating an example of a high voltage device.

FIG. 2 is a cross-sectional view illustrating an example of a high voltage device. Herein, an N-channel metal-oxide-semiconductor (NMOS) transistor is described as an example among high voltage devices.

Referring to FIG. 2, the high voltage device includes an isolation layer 205A formed over a substrate 200 in order to isolate neighboring drift regions 206. The isolation layer 205A has a trench structure formed deeper than a lowermost portion of the drift region 206 and a width of the isolation layer 205A is the same as a distance between the neighboring drift regions 206.

The width and the depth of the isolation layer 205A are determined as described hereinafter.

Figure 4A:
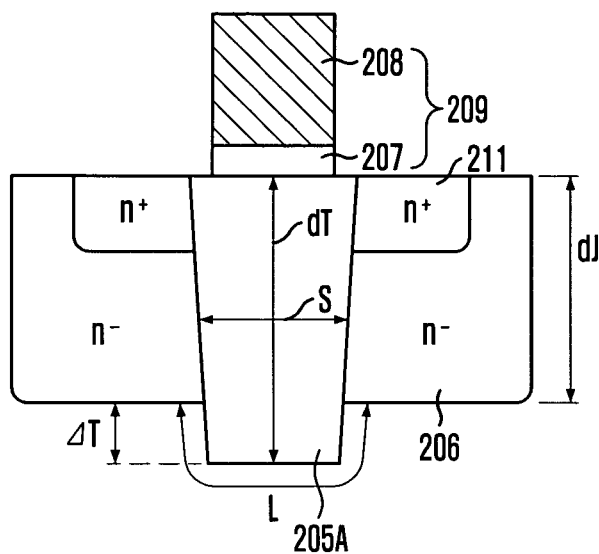
FIG. 4A is a cross-sectional view illustrating an example of the high voltage device including an isolation layer between neighboring drift regions.
Figure 4B:
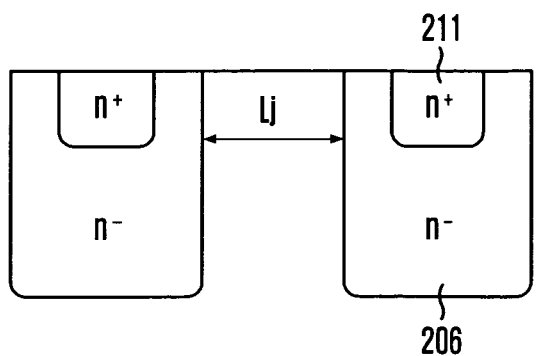
FIG. 4B illustrates a cross-sectional view of a high voltage device including a plurality of drift regions separated from each other by a predetermined distance without an isolation layer.

FIG. 4A is a cross-sectional view illustrating an example of the high voltage device including an isolation layer between neighboring drift regions, and FIG. 4B illustrates a cross-sectional view of a high voltage device including a plurality of drift regions separated from each other by a predetermined distance without an isolation layer.

Referring to FIGS. 2, 3I, 4A, and 4B, when the width and the depth of the isolation layer 205A, a distance between the neighboring drift regions 206 capable of standing breakdown voltage, a depth of the drift region 206 and a depth difference between the drift region 206 and the isolation layer 205A are denoted as S, dT, Lj, dJ and $\Delta T$, respectively, as equations explaining the structure shown in FIGS. 4A and 4B may be represented as '$\Delta T = dT - dJ$' and '$L \geq Lj$'. 'L' represents a distance between neighboring drift regions 206 when the isolation layer 205A is formed between the neighboring drift regions 206. Herein, 'L' may be represented as follows:

$$L \approx 2(dT-dJ)+S = 2\Delta T + S \qquad \text{[Equation 1]}$$

Thus, the isolation layer 205A should have a depth greater than that of the drift region 206 in order to avoid the generation of a field stop area (FSA). That is, '$\Delta T \geq 0$'.

In the meantime, when 'dJ' is increased, 'dT' should also be increased. Therefore, it is hard to form the isolation layer 205A since a filling characteristic of the isolation layer 205A may be deteriorated due to increasing of an aspect ratio of that. Thus, 'dJ' should be controlled as shallow as possible. For this, the drift region 206 may be formed by using an ion implantation process in lieu of a diffusion process since it is easy to control a depth of the drift region 206 when the ion implantation is performed. However, when the diffusion process is performed to form the drift region 206, ion diffusion may be controlled to be minimized in a drive-in process is performed. Herein the drive-in process is performed after performing a pre-deposition process.

Furthermore, referring to Equation 1, when 'L' is fixed since 'L' is in proportion to 'ΔT' and 'S', 'S' may be relatively decreased when 'ΔT' is increased. Meanwhile, ΔT may not be unconditionally increased in aspects of process and device characteristics. 'L' is usually set to 'Lj' and plus approximately 20 percent of 'Lj' by considering a process margin, and may be set to 'Li' plus approximately 20 percent to approximately 50 percent of 'Lj'. That is, it is represented as 'Lj×1.2≦L≦Lj×1.5'.

A high voltage device for 18 V will be described hereinafter as an example, wherein the high voltage device for 18V represents the high voltage device operating at 18V.

For example, the depth of the drift region 206, dJ, which may be controlled by an ion implantation process, ranges from approximately 0.6 μm to approximately 0.8 μm. Thus, the isolation layer 205A should be formed to have the depth, dT, greater than dJ, e.g., more than approximately 1 μm, and may be formed to have the depth more than approximately 1 μm to approximately 1.5 μm.

Furthermore, the distance between neighboring drift regions 206, Lj, should be maintained ranging from approximately 1.0 μm to approximately 1.2 μm in order to ensure breakdown voltage appropriate to the high voltage device for 18 V. Therefore, the width of the isolation layer 205A, S, is maintained approximately 1.0 μm, e.g., approximately 1 to approximately 1.2 μm. A width of an isolation layer in a typical high voltage device for 18 V is approximately 2.5 μm to approximately 4.0 μm.

Hereinafter, characteristics of examples of a typical high voltage device and a high voltage device are described.

Figure 5A:
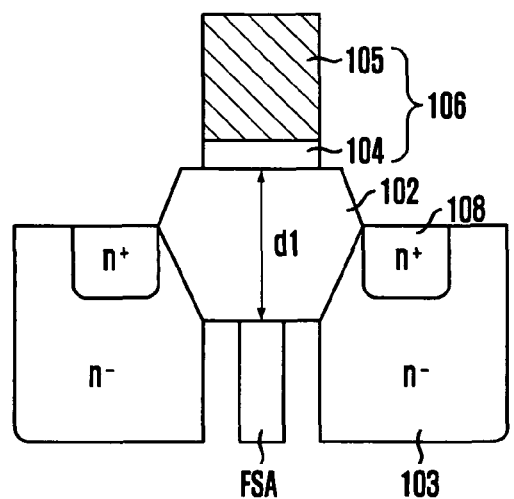
FIGS. 5A and 5B illustrate cross-sectional views for comparing a typical high voltage device and an inventive high voltage device.
Figure 5B:
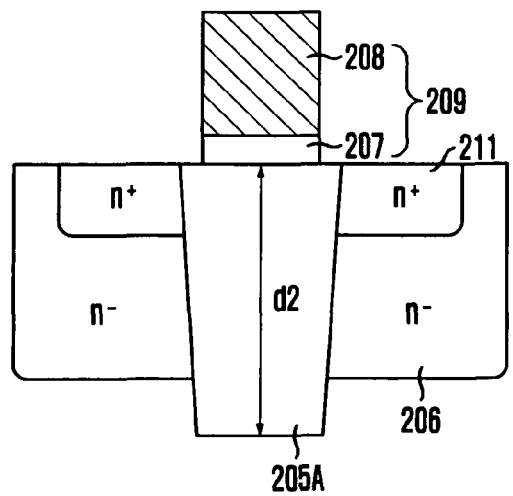

FIG. 5A illustrates a cross-sectional view of the typical high voltage device and FIG. 5B is a cross-sectional view illustrating an example of the high voltage device in accordance with general aspects.

Referring to FIGS. 5A and 5B, for example, since the drift region 103 is formed deeper than the lowermost portion of the field oxide layer 102 in the typical high voltage device, mask arrangement is essentially demanded in order to perform the stable isolation between neighboring drift regions 103 during an ion implantation process for forming the drift region 103. However, since the isolation layer 205A is formed deeper than the drift region 206 in the high voltage device in accordance with general aspects, the drift region 206 is self-aligned on sidewalls of the isolation layer 205A through the ion implantation process. Thus, a process for forming the drift region 206 may be simplified since an additional mask alignment is not needed.

Secondly, since the field oxide layer 102 is thin in the typical high voltage device, a channel is easily induced due to a short distance 'd1' between the gate electrode 106 and the lowermost portion of the field oxide layer 102. That is, since a threshold voltage becomes low, the FSA is essentially demanded in order to reinforce the low threshold voltage. In that case, since an area where the FSA is formed is needed, a field region is increased that much. However, since a distance 'd2' between the gate electrode 209 and the lowermost portion of the isolation layer 205A is large enough in the high voltage device in accordance with general aspects, a channel induction is difficult as that much and thus there is no need to form an additional FSA like in the typical high voltage device. That is, for example, an effect for decreasing a field region may be obtained since the area to form the FSA is unnecessary.

In the meantime, although it will be described hereinafter, the isolation layer 205A may include a silicon-containing oxide layer, e.g., a silicon dioxide layer ($SiO_2$). The isolation layer 205A may be formed by using a high density plasma apparatus in order to improve filling-up characteristics according to a high aspect ratio of the isolation layer 205A. For example, the isolation layer 205A may be formed of a high density plasma-undoped silicate glass (HDP-USG) layer. Besides this, the isolation layer 205A may also be formed with a stacked structure of the HDP layer and a layer formed by a spin coating method, e.g., a spin on dielectric (SOD) layer.

Hereinafter, a method for fabricating the high voltage device will be described in detail.

FIGS. 3A to 3I cross-sectional views illustrating an example of a method for fabricating the high voltage device in accordance with the general aspect shown in FIG. 2.

FIGS. 3A to 3I illustrate cross-sectional views of a method for fabricating the high voltage device in accordance with the embodiment of the present invention shown in FIG. 2.

Figure 3A:
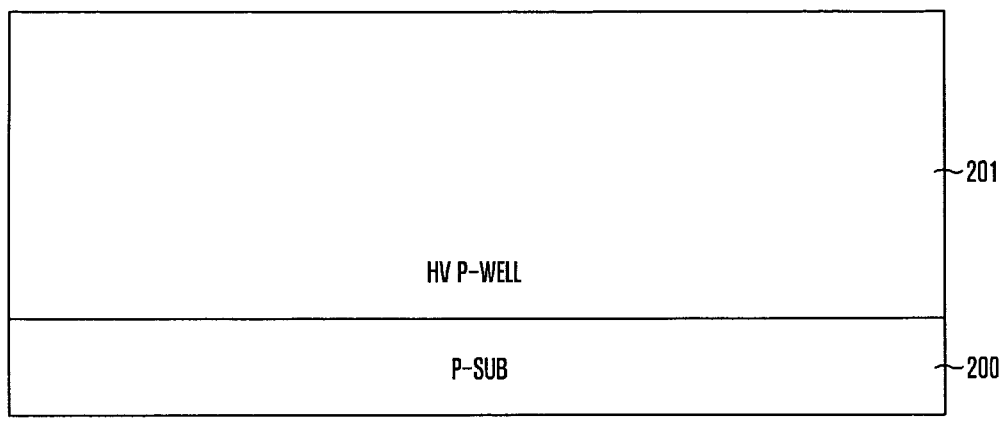
FIGS. 3A to 3I are cross-sectional views illustrating an example of a method for fabricating a high voltage device

Referring to FIG. 3A, a well region 201 for a high voltage is formed in the substrate 200, wherein the substrate 200 may be a p-type substrate. Herein, the substrate 200 may include one selected from a group consisting of silicon (Si), germanium (Ge), silicon germanium (SiGe), gallium phosphorus (GaP), gallium arsenic (GaAs), silicon carbon (SiC), silicon-germanium-carbon (SiGeC), indium arsenide (InAs) and indium phosphorus (InP). Furthermore, the substrate 200 may be a bulk or silicon on insulator (SOI) substrate.

Figure 3B:
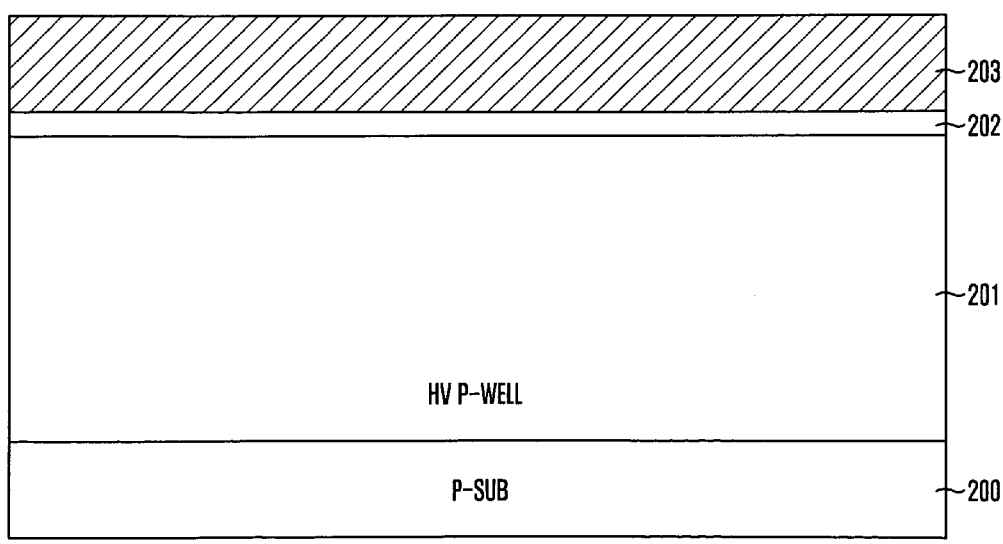

Referring to FIG. 3B, a buffer layer 202 may be formed over the substrate 200. The buffer layer 202 is formed to protect the substrate 200 from a stress caused during a deposition process and a removing process of a hard mask 203 to be formed in a subsequent process. Thus, the buffer layer 202 may be formed of a material having an etch selectivity to the hard mask 203. For example, when the hard mask 203 includes a nitride layer such as a silicon nitride ($Si_3N_4$) layer, the buffer layer 202 includes a silicon dioxide ($SiO_2$) layer formed by an oxidation process. The oxidation process may be performed by using a dry oxidation process, a wet oxidation process or an oxidation process using radical ion.

Then, the hard mask 203 is formed over the buffer layer 202. The hard mask 203 may act as an etch stop layer in order to compensate for lack of a thickness of a photoresist pattern used as an etch mask. The hard mask 203 may include a nitride layer such as a silicon nitride ($Si_3N_4$) layer and may be formed by using a low pressure chemical vapor deposition (LPCVD) process in order to minimize the stress caused during the forming of the hard mask 203.

Figure 3C:
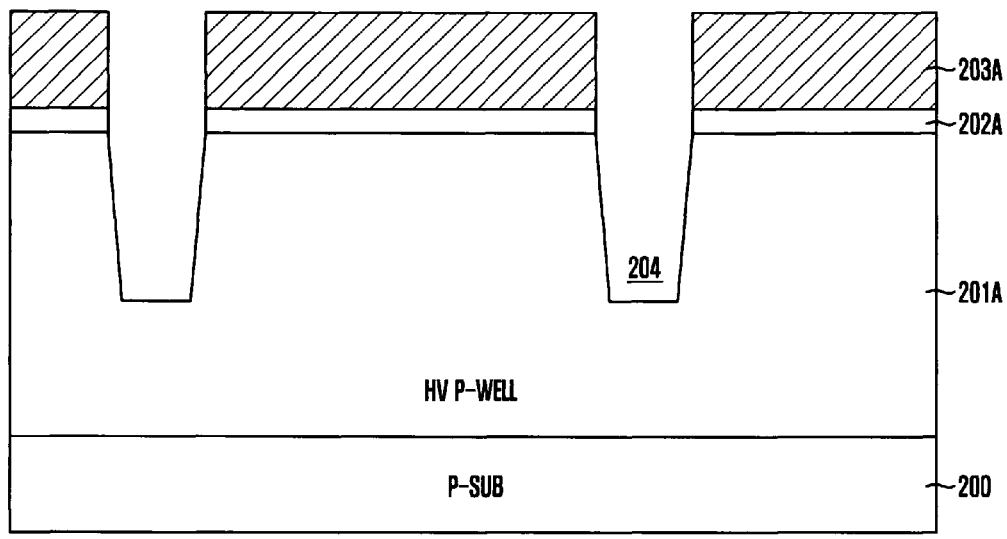

Referring to FIG. 3C, a trench 204 is formed by selectively etching a portion of the hard mask 203, the buffer layer 202 and the well region 201. Herein, the resultant elements are represented as hard mask patterns 203A, buffer patterns 202A and an etched well region 201A. The trench 204 is formed with a depth greater than that of a drift region (206 of FIG. 3F) which will be formed in a subsequent process. For example, the depth of the trench 204 ranges from approximately 1.1 times to approximately 2 times of the depth of the drift region 206. For example, the trench 204 has the depth approximately 0.1 μm to approximately 1 μm greater than that of the drift region 206.

In another general aspect, a compensation layer (not shown) may be further formed along inside walls of the trench 204, wherein the compensation layer is formed to compensate a damaged portion formed during the forming of the trench 204 and decrease a critical dimension of an active region. The compensation layer may be formed by using an oxidation process and a thickness of the same is approximately 50 Å to 100 Å.

Figure 3D:
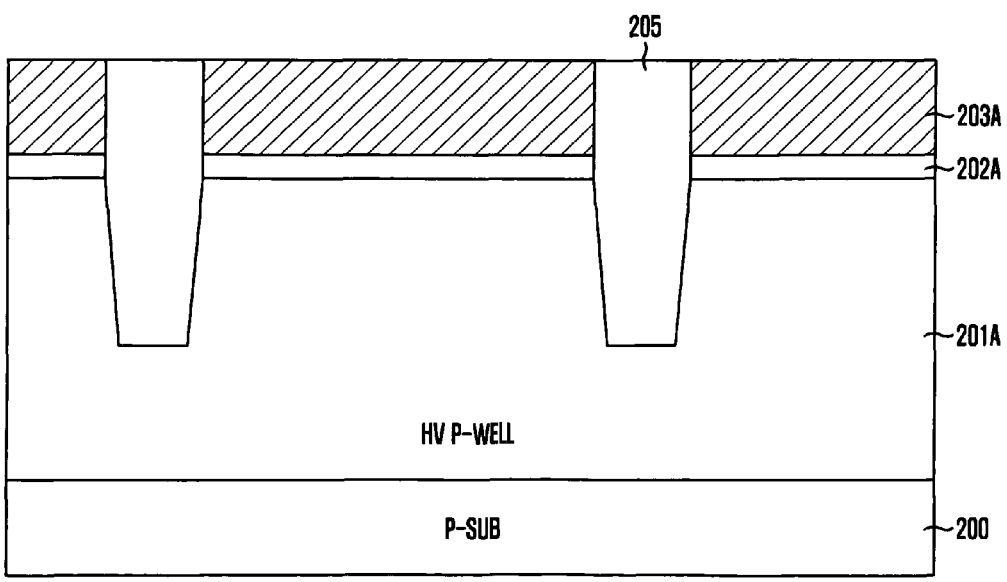

Referring to FIG. 3D, an insulation layer for device isolation is formed to fill the trench 204 and then, a planarization process is performed on the insulation layer to form an isolation layer 205. The isolation layer 205 includes an HDP layer or a stacked structure of an HDP layer and an SOD layer. Furthermore, the planarization process may be performed by using an etch back process or a chemical mechanical polishing (CMP) process. When the CMP process is performed, slurry for polishing an oxide layer is used while using the hard mask patterns 203A as a polishing stop layer.

Figure 3E:
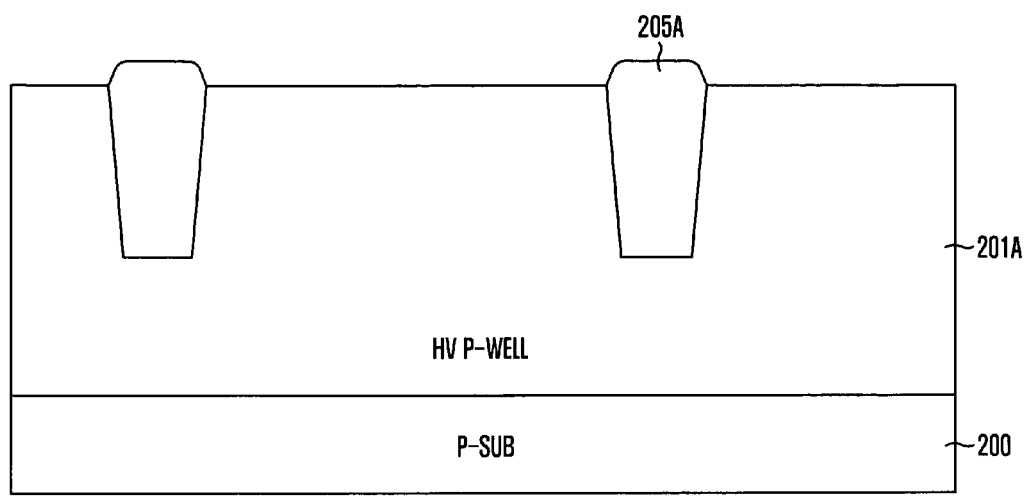

Referring to FIG. 3E, the hard mask patterns 203A are removed. The removing of the hard mask patterns 203A may be performed by using a phosphoric acid ($H_3PO_4$) solution. Then, the buffer patterns 202A are removed. The removing of the buffer patterns 202A may be performed by using a diluted hydro fluoride (DHF) solution or a buffered oxide etchant (BOE) solution.

A portion of the isolation layer 205 may be etched during the removing of the hard mask patterns 203A and the buffer patterns 202A, so that there is formed an etched isolation layer 205A having a protruding portion with a steady profile as shown in FIG. 3E.

Figure 3F:
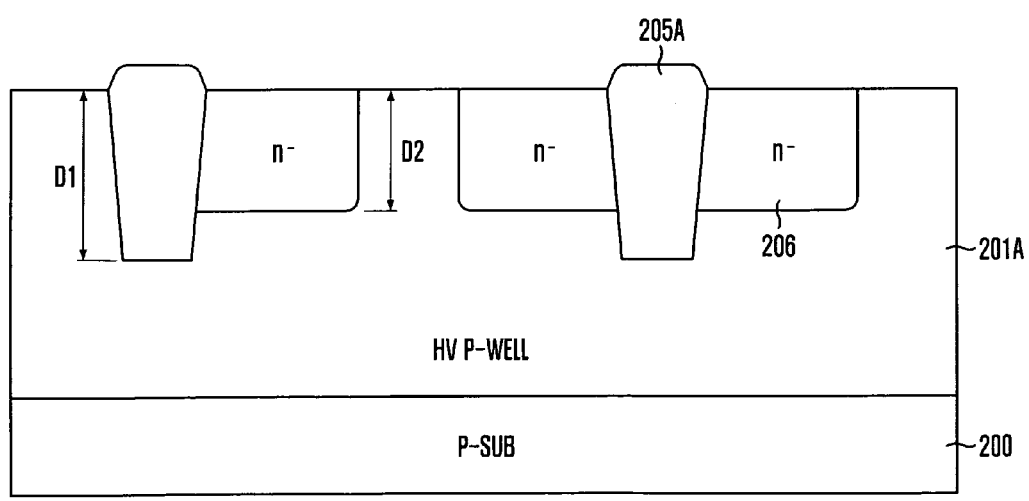

Referring to FIG. 3F, the drift region 206 is formed in the etched well region 201A. Herein, the drift region 206 is may be formed by using an ion implantation process in lieu of a diffusion process and a depth D2 of the drift region 206 should be less than the depth D1 of the trench 204. For example, the depth of the drift region 206 ranges from approximately a half to approximately 0.91 times of the depth of the trench 204. As another example, the drift region 206 has the depth approximately 0.1 μm to approximately 1 μm less than that of the trench 204.

Furthermore, when forming an NMOS transistor, the drift region 206 is formed by using n-type impurity ions such as phosphorus (P) or arsenide (As). When forming a PMOS transistor, the drift region 206 is formed by using p-type impurity ions such as boron (B). Moreover, the drift region 206 is formed to have the concentration less than the concentration of a source/drain region (211 of FIG. 3H) to be formed in a subsequent process.

Figure 3G:
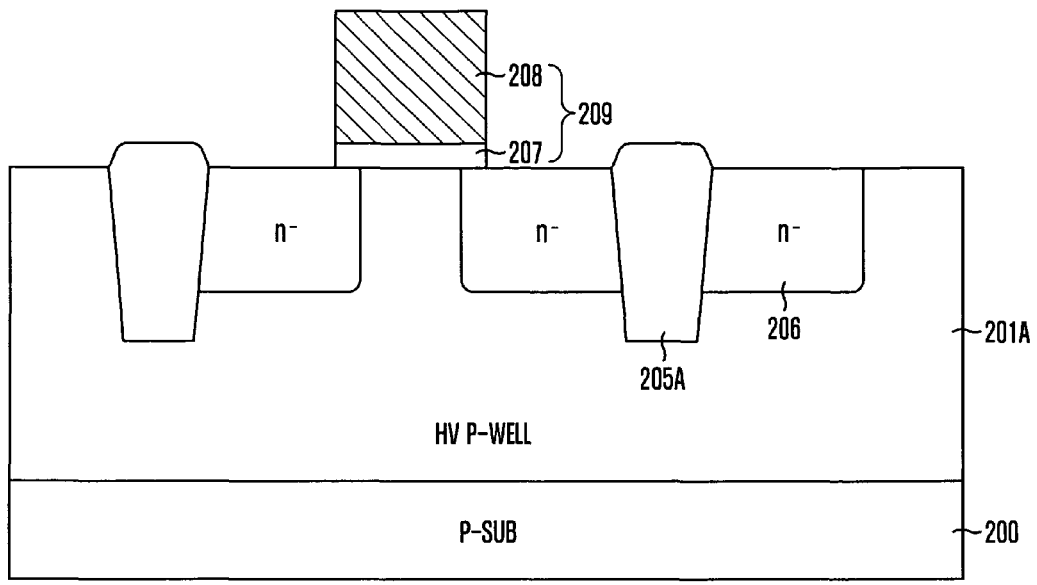

Referring to FIG. 3G, the insulation layer 207 for a gate is formed over the substrate 200. The insulation layer 207 may include a silicon dioxide ($SiO_2$) layer. Alternatively, the insulation layer 207 may be formed by performing a heat treatment process using nitride such as a nitrogen ($N_2$) gas after forming a silicon dioxide ($SiO_2$) layer to form a nitride layer at an interface between the silicon dioxide layer and the etched well region 201A. The insulation layer 207 may be formed by using a dry oxidation process, a wet oxidation process or an oxidation process using radical ions. However, as a matter of considering characteristics of the insulation layer 207, the forming of the insulation layer 207 may be performed by using the dry oxidation process or the wet oxidation process in lieu of the oxidation process using the radical ions. In the meantime, the heat treatment using the $N_2$ gas may be performed in a furnace. The insulation layer 207 has a thickness ranging from approximately 50 Å to approximately 100 Å.

The conductive layer 208 for the gate is formed over the insulation layer 207. Herein, the conductive layer 208 may include any conductive materials. For example, the conductive layer 208 may include one of polysilicon, transition metals and rare earth metals. The polysilicon layer includes an undoped polysilicon layer which is not doped with impurities and a doped polysilicon layer which is doped with impurities, wherein impurity ions are doped into the undoped polysilicon layer in a subsequent ion implantation process when the undoped polysilicon layer is used. The polysilicon layer is formed by using an LPCVD method. The LPCVD method is performed by using a silane ($SiH_4$) gas as a source gas and using a phosphine ($PH_3$) gas, a boron trichloride ($BCl_3$) gas or a diborane ($B_2H_6$) gas as a doping gas. The transition metals include Fe, Co, W, Ni, Pd, Pt, Mo and Ti and the rare earth metals include Er, Yb, Sm, Y, La, Ce, Tb, Dy, Ho, Tm and Lu. The gate electrode 209 is formed by etching portions of the conductive layer 208 and the insulation layer 207.

Figure 3H:
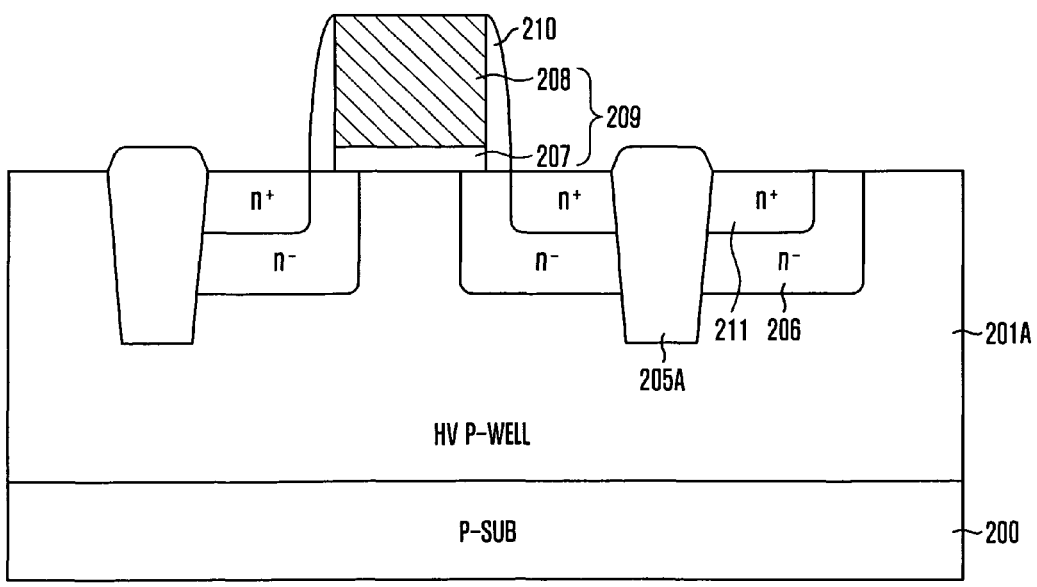

Referring to FIG. 3H, the spacers 210 are formed on sidewalls of the gate electrode 209. The spacers 210 may include an oxide layer, a nitride layer or a stacked structure of the oxide layer and the nitride layer. The source/drain regions 211 are formed in the drift region 206 exposed by the spacers 210, wherein the source/drain regions 211 are formed by an ion implantation process while having the same conduction-type as the drift region 206. However, a doping concentration of the source/drain regions is greater than that of the drift region 206.

Figure 3I:
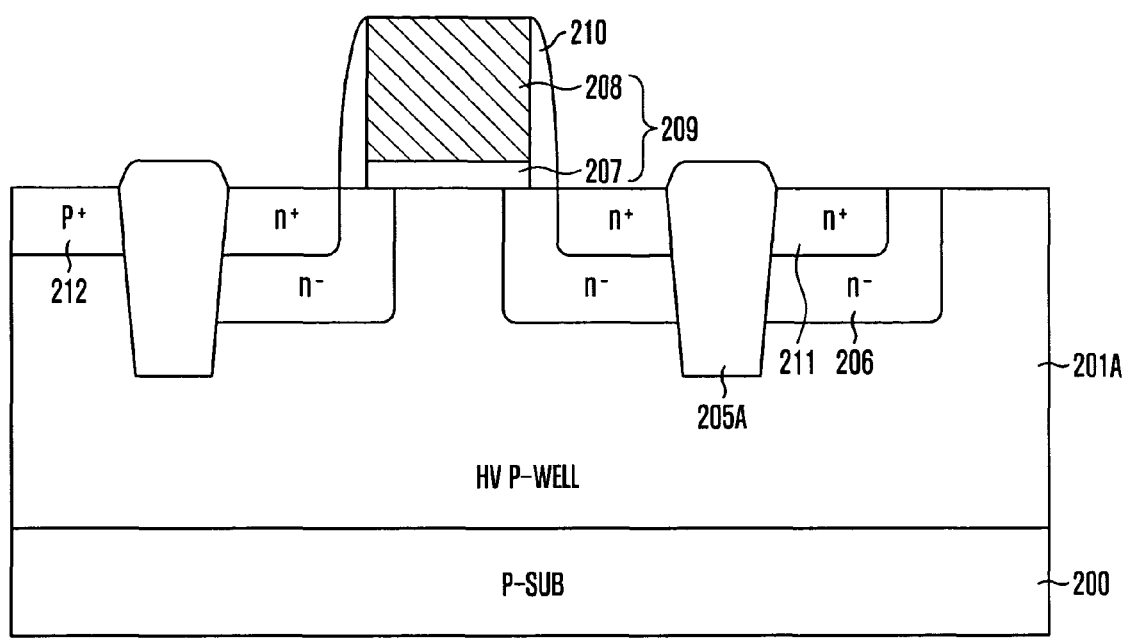

Referring to FIG. 3I, the pick-up region 212 is formed in the etched well region 201A, wherein the pick-up region 212 has the same conduction-type as the etched well region 201A.

Since subsequent processes are the same as other conventional processes, the processes are not described herein.

General aspects including the above described elements have the following effects.

For example, the forming of the FSA can be omitted as neighboring drift regions are isolated by an isolation layer formed deeper than a drift region. Thus, a width of a field region can be decreased since there is no need to secure an area for the FSA. Furthermore, the high integration of devices can be obtained. Moreover, a process for fabricating a device can be simplified since there is no need to form the FSA.

In addition, as neighboring drift regions are isolated by an isolation layer formed deeper than a drift region, a location margin of a gate electrode can be ensured by maximally controlling the inducement of a channel under the isolation layer. That is, even though the gate electrode is formed over the isolation layer, the channel cannot be induced under the isolation layer due to the isolation layer having the greater depth than the drift regions. Thus, the location margin of the gate electrode during the forming of the gate electrode is ensured that much.

Moreover, as neighboring drift regions are isolated by an isolation layer formed deeper than drift regions, the drift regions can be formed on sidewalls of the isolation layers with a self-aligned method. Thus, a process for fabricating a device can be simplified since there is no need to perform an additional mask alignment.

While a number of examples have been described above, it will be understood that these examples are illustrative and not limitative. For example, it will be apparent to those skilled in the art that various changes, modifications, and implementations may be made within the scope of the following claims.

What is claimed is:

1. A high voltage transistor, comprising:
    drift regions each formed to have a sufficient depth into a substrate so as to be capable of withstanding a high voltage under which the high voltage transistor operates;
    an isolation layer having a depth greater than a depth of the drift regions, two of the drift regions being formed on opposing sides of the isolation layer and being isolated by the isolation layer;
    a gate electrode formed over the substrate;

a first source region and a first drain region of the transistor formed respectively in the two drift regions formed on the opposing sides of the isolation layer;

a second source region or a second drain region formed in one of the drift regions formed on an opposite side of the gate electrode from the isolation layer; and spacers formed about the gate electrode and contacting two of the drift regions formed on opposing sides of the gate electrode, wherein the two drift regions formed on the opposing sides of the isolation layer and the drift region formed on the opposite side of the gate electrode from the isolation layer have a same conductivity type.

2. The high voltage transistor as recited in claim 1, wherein the depth of the isolation layer is approximately 1.1 times to approximately 2 times greater than the depth of the drift regions.

3. The high voltage transistor as recited in claim 1, wherein the depth of the isolation layer is approximately 0.1 µm to approximately 1 µm greater than the depth of the drift regions.

4. The high voltage transistor as recited in claim 1, wherein at least one side of the two of the drift regions that are isolated by the isolation layer contacts the isolation layer.

5. The high voltage transistor as recited in claim 1, wherein the high voltage is greater than or equal to 18V.

6. The high voltage transistor as recited in claim 1, wherein the isolation layer comprises high density plasma-undoped silicate glass.

7. The high voltage transistor as recited in claim 1, wherein the isolation layer has a width in a range of approximately 1.0 µm to approximately 1.2 µm.

8. The high voltage transistor as recited in claim 1, further comprising a pick-up region provided on a side of the gate electrode opposite the isolation layer.

9. The high voltage transistor as recited in claim 8, further comprising a second isolation layer provided between the pick-up region and the gate electrode.

10. The high voltage transistor as recited in claim 1, wherein a distance L between the two of the drift regions that are isolated by the isolation layer when the isolation layer is formed therebetween satisfies a relationship $Lj \times 1.2 \leq L \leq Lj \times 1.5$, where Lj corresponds to a distance between the two of the drift regions that are isolated by the isolation layer that is capable of withstanding the high voltage.

11. The high voltage transistor as recited in claim 10, wherein the distance L satisfies a relationship $L=2\Delta T+S$, where $\Delta T$ corresponds to a difference between respective depths of the two of the drift regions that are isolated by the isolation layer and the isolation layer, and S corresponds to a width of the isolation layer.

12. A high voltage transistor, comprising:
a substrate;
an isolation layer extending into the substrate;
two neighboring drift regions formed symmetrically about the isolation layer, each of the two neighboring drift regions having depths extending into the substrate that are less than a depth of the isolation layer extending into the substrate;
a first source region and a first drain region of the transistor formed in the two neighboring drift regions;
a gate electrode formed over the substrate;
a second source region or a second drain region provided on an opposite side of the gate electrode from the two neighboring drift regions;
two spacers formed on opposite sides of the gate electrode, one of the spacers contacting one of the two neighboring drift regions;

a third drift region formed on the opposite side of the gate electrode from the two neighboring drift regions, the second source region or the second drain region being formed in the third drift region, and the two neighboring drift regions and the third drift region having a same conductivity type.

13. The high voltage transistor as set forth in claim 12, wherein the first source region or the first drain region has a concentration of impurities that is greater than a concentration of impurities of one of the two neighboring drift regions in which the first source region or the first drain region is formed.

14. The high voltage transistor as set forth in claim 12, wherein the depth of the isolation layer ranges from approximately 1.1 times to approximately 2 times greater than one of the respective depths of the two neighboring drift regions.

15. The high voltage transistor as set forth in claim 12, wherein the depth of the isolation layer is approximately 0.1 µm to approximately 1 µm greater than one of the respective depths of the two neighboring drift regions.

16. The high voltage transistor as set forth in claim 12, wherein at least one of the two neighboring drift regions has one side thereof in contact with the isolation layer.

17. The high voltage transistor as recited in claim 12, wherein the isolation layer comprises spin on dielectric.

18. The high voltage transistor as recited in claim 12, wherein the isolation layer has a width in a range of approximately 1.0 µm to approximately 1.2 µm.

19. The high voltage transistor as recited in claim 12, further comprising a pick-up region provided on a side of the gate electrode opposite the isolation layer.

20. The high voltage transistor as recited in claim 19, further comprising a second isolation layer provided between the pick-up region and the gate electrode.

21. The high voltage transistor as recited in claim 12, wherein a distance L between the two of the drift regions that are isolated by the isolation layer when the isolation layer is formed therebetween satisfies a relationship $Lj \times 1.2 \leq L \leq Lj \times 1.5$, where Lj corresponds to a distance between the two of the drift regions that are isolated by the isolation layer that is capable of withstanding the high voltage.

22. The high voltage transistor as set forth in claim 21, wherein the distance L satisfies a relationship $L=2\Delta T+S$, where $\Delta T$ corresponds to a difference between the depth of the isolation layer and a greater one of the depths of the two neighboring drift regions, and S corresponds to a width of the isolation layer.

23. The high voltage transistor as set forth in claim 21, wherein the high voltage is greater than or equal to 18V.

24. A high voltage transistor, comprising:
a first drift region, a second drift region, and a third drift region formed in a substrate in that order along a lateral direction of the transistor such that the first, second and third drift regions are each capable of withstanding a voltage under which the high voltage transistor operates;
an isolation layer formed in the substrate between the first and second drift regions and having a depth greater than depths of the first and second drift regions;
a gate electrode formed over the substrate;
source and drain regions, wherein either a source or a drain region is formed in both the first and third drift regions, and either a drain or a source region is formed in the second drift region; and
spacers formed about the gate electrode and contacting the second and third drift regions, wherein the first, second and third drift regions have a same conductivity type.

\* \* \* \* \*